United States Patent [19]

Molloy

[11] Patent Number: 4,833,423
[45] Date of Patent: May 23, 1989

[54] APPARATUS AND METHOD FOR A WIDE-BAND DIRECT-COUPLED TRANSISTOR AMPLIFIER

[75] Inventor: John J. Molloy, Tucson, Ariz.

[73] Assignee: Apex Microtechnology Corporation, Tucson, Ariz.

[21] Appl. No.: 75,084

[22] Filed: Jul. 20, 1987

[51] Int. Cl.⁴ .............................................. H03F 3/30
[52] U.S. Cl. ..................... 330/265; 330/270
[58] Field of Search ............... 330/265, 266, 267, 268, 330/270

[56] References Cited

U.S. PATENT DOCUMENTS

| | | | |
|---|---|---|---|
| 4,121,168 | 10/1978 | Stitt | 330/265 |
| 4,356,452 | 10/1982 | Iwamatsu | 330/267 X |
| 4,358,739 | 11/1982 | Nelson | 330/255 |
| 4,502,020 | 2/1985 | Nelson et al. | 330/265 |

FOREIGN PATENT DOCUMENTS 119908  7/1984  Japan ..................................... 330/265

Primary Examiner—James B. Mullins
Attorney, Agent, or Firm—William W. Holloway

[57] ABSTRACT

In a wide-band direct-coupled transistor amplifier, the current through the power output stage must be stabilized to prevent fluctuations in the amplifier output signal. To stabilize the output stage current, a negative feedback loop is established providing a bias control for the amplifier input stage. In the past, voltage feedback apparatus, typically including operational amplifiers, has been utilized. In the present invention, a current feedback path, which avoids the voltage level translation inherent in the prior art, is used to provide the feedback bias control for the input stage of the amplifier. A technique for the compensation of temperature drift and for voltage offset is described.

19 Claims, 6 Drawing Sheets

APPARATUS AND METHOD FOR A WIDE-BAND DIRECT-COUPLED TRANSISTOR AMPLIFIER

BACKGROUND OF THE INVENTION

1. Field of the Invention

This invention relates generally to the amplification of electrical signals and, more particularly, to wide-band direct-coupled transistor amplifiers.

2. Description of the Related Art

Because of the wide variety of uses for a wide-band direct-coupled amplifier, effort has been expended in improving the design of such devices. One problem that can arise when these amplifiers are implemented with transistors is that the signal in the output stage can vary in a manner that is not related to the an input signal. For example, when transistors in the output stage are subjected to high currents, the temperature of the transistors can be elevated, causing a variation in the transistor parameters. This parameter variation can result in an internally generated change in the output signal. To eliminate these and other parameter changes resulting in similarly undesirable output signal changes, open-loop compensating techniques can be employed. For example, thermally induced temperature changes can be compensated by insertion of thermally coupled components having similar characteristics. Because of aging, difficulty of component characteristic matching and other difficulties, the internally generated signal fluctuations are usually minimized through the use of negative feedback techniques.

Referring to FIG. 1, a wide-band direct-coupled transistor amplifier, according to the prior art, is shown. The amplifier typically includes an input stage 1 for receiving an amplifier input signal, an output stage for receiving a signal (or signals) from the input stage 2 and for providing an amplifier output signal and a feedback stage 3 for taking a signal (or signals) from the output stage 2 and applying the signal or signals to the input stage in a relationship that inhibits undesired fluctuations in the amplifier output signal. FIG. 1 shows the input signal $V_{IN}$ as being applied to a two pairs of complementary bipolar transistors (Q11 and Q12, Q13 and Q14) and the output signal as the signal developed between a pair of complementary transistors (Q18 and Q19), a common implementation configuration. Also shown (with dotted lines) is a configuration involving $R_{INPUT}$ and $R_{REF}$ wherein the amplifier can coupled as a feedback amplifier.

In the related art, the feedback path is typically implemented with voltage amplifiers. For example, in U.S. Pat. No. 4,502,020 entitled Settling Time Reduction in Wide-Band Direct-Coupled Transistor Amplifiers, the bias control circuit of FIG. 1 and FIG. 2 are shown, in FIG. 10, FIG. 11, FIG. 12 and FIG. 13, as being implemented with operational amplifiers. The use of operational amplifiers is both relatively slow and requires careful circuit design and adjustment in order to provide the appropriate voltage levels and voltage translation.

A need has therefore been felt for wide-band direct-coupled transistor amplifier having a feedback path which is relatively simple to implement and which has an expanded frequency response. A need has also been felt for a technique that would permit temperature compensation and voltage off-set correction without complex circuit implementations.

FEATURES OF THE INVENTION

It is an object of the present invention to provide an improved transistor amplifier.

It is a feature of the present invention to provide an improved wide-band direct-coupled transistor amplifier.

It is another feature of the present invention to provide a feedback stage for an amplifier circuit that eliminates the need for voltage level translation techniques.

It is yet another feature of the present invention to provide a transistor amplifier having compensation of the temperature coefficient and the voltage offset differences.

It is still another feature of the present invention to provide for increased gain in the feedback stages of a transistor amplifier.

It is a more particular feature of the present invention to provide increased gain in the feedback path of a transistor amplifier through the use of current source devices.

It is a still further feature of the present invention to provide an improved electrical coupling between the input stage and the output stage of a transistor amplifier.

It is still another feature of the present invention to provide a transistor amplifier for responding to a transient imbalance in the current flowing through the output transistors.

SUMMARY OF THE INVENTION

The aforementioned and other features are accomplished, according to the present invention, by providing a transistor amplifier with feedback apparatus that uses current driven components to minimize internally generated signal fluctuations in the output stage. The use of current driven components avoids the need for voltage level translation techniques and increases the frequency response. The current through the transistors of the output stage of the amplifier are monitored and changes are returned, in a negative feedback mode, to the input stage. A technique is described for responding to a transient imbalance in the current through transistors in the output stage thereby enhancing the slew rate. Techniques are also described for improving the transfer of signals from the input stage to the output stage of the amplifier. By use of trimmable resistors, the voltage offset level between the two input terminals as well as the temperature drift can be compensated for without a multiplicity of iterations.

These and other features of the present invention will be understood upon reading of the following description along with the drawings.

DESCRIPTION OF THE PREFERRED EMBODIMENT

1. Detailed Description of the Figures

Figure 1:
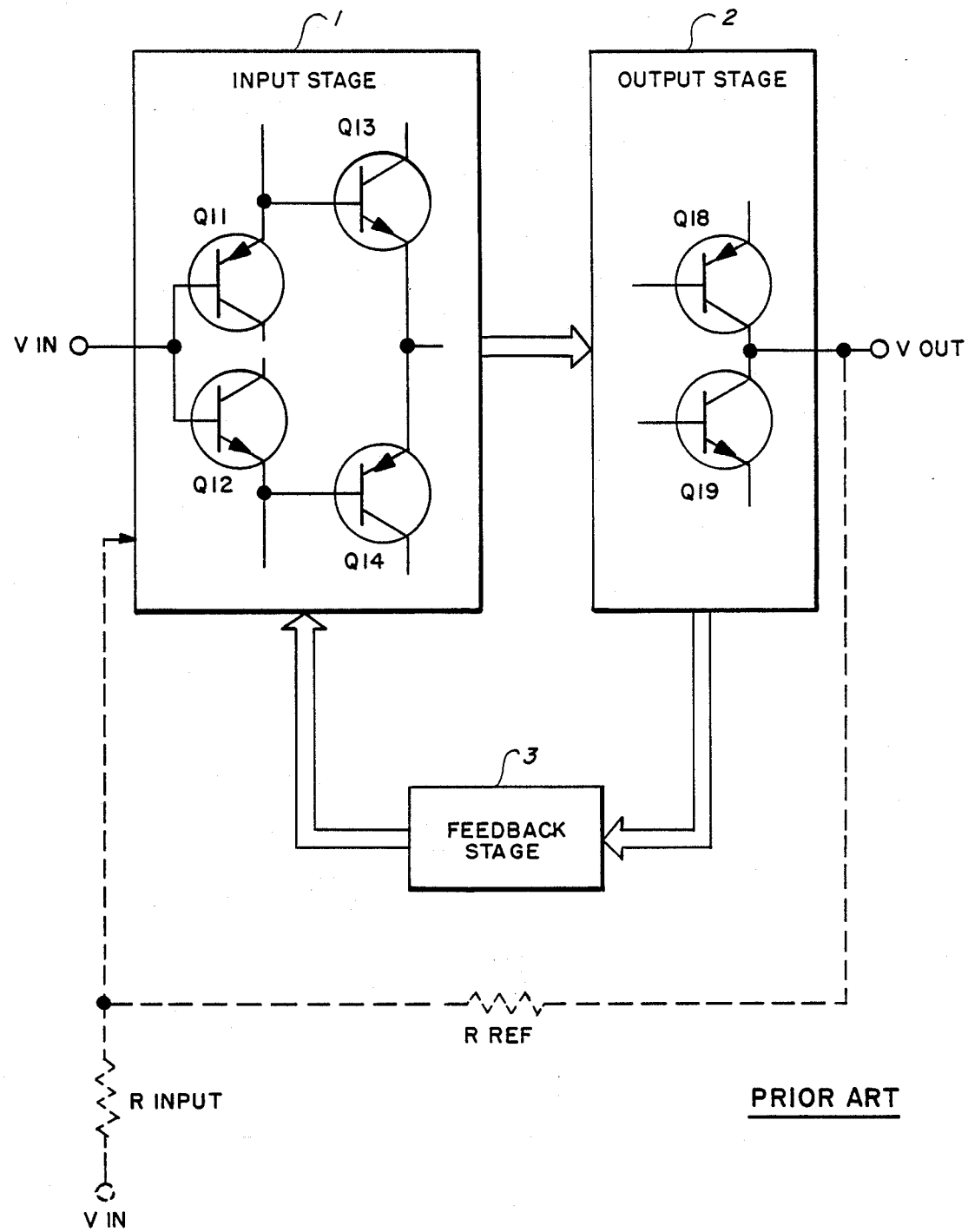
FIG. 1 is a block diagram of a wide-band direct-coupled transistor amplifier along with typical circuit components according to the prior art.

FIG. 1 has been discussed with reference of the related art.

Figure 2:
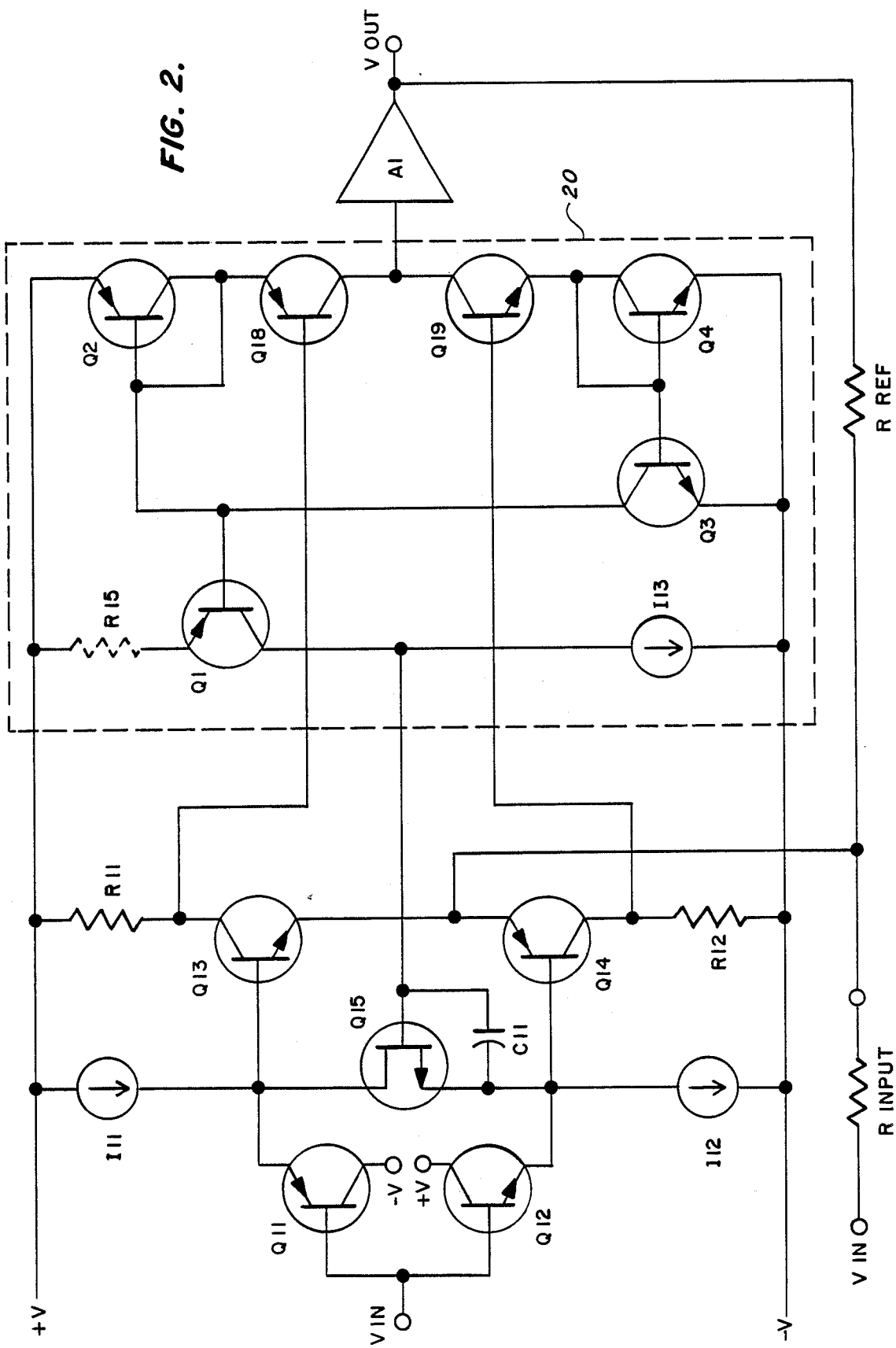
FIG. 2 is a circuit diagram of one embodiment of direct-coupled wide-band transistor amplifier according to the present invention.

Referring next to FIG. 2, the input signal $V_{IN}$ is applied to the base terminals of PNP transistor Q11 and NPN transistor Q12. The collector terminal of transistor Q11 is coupled to the negative voltage supply, while the collector terminal of transistor Q12 is coupled positive voltage supply. An emitter terminal of transistor Q11 is coupled to a base terminal of NPN transistor Q13, while an emitter terminal of transistor Q12 is coupled to a base terminal of PNP transistor Q14. A field effect transistor Q15 has a drain terminal coupled to the base terminal of transistor Q13 and a source terminal coupled to the base terminal of transistor Q14. The base terminal of transistor Q13 is coupled through a current source I11 to the positive voltage supply, while the base terminal of transistor Q14 is coupled through current source I12 to the negative voltage supply. The collector terminal of transistor Q13 is coupled through resistor R11 to the positive voltage supply and to a base terminal of PNP transistor Q18, while the collector terminal of transistor Q14 is coupled through resistor R12 to the negative supply terminal and to a base terminal of NPN transistor Q19. The gate terminal of transistor Q15 is coupled through capacitor C11 to the source terminal of transistor Q15, through current source I13 to the negative voltage voltage and to the collector terminal of PNP transistor Q1. The emitter terminal of transistor Q1 is coupled to the positive voltage supply. The base terminal of transistor Q1 is coupled to the base terminal of transistor PNP Q2, to the collector terminals of transistors Q2 and Q3 and to the emitter terminal of transistor Q18. The emitter terminal of transistor Q2 is coupled to the positive voltage supply. The emitter terminal of transistor Q3 is coupled to the negative voltage supply, while the base terminal of transistor Q3 is coupled to a collector terminal of NPN transistor Q4 and a base terminal of transistor Q4. The emitter terminal of transistor Q4 is coupled to the negative voltage supply. The collector terminal of transistor Q19 is coupled to the collector terminal of transistor Q18 and to an input terminal of output driver amplifier A1. The output terminal of the driver amplifier A1 provides the output signal for amplifier circuit. The output terminal of amplifier A1 is coupled through $R_{REF}$ to the emitter terminal of transistor Q13, the emitter terminal of Q14 and a first terminal of resistor $R_{INPUT}$.

Figure 3:
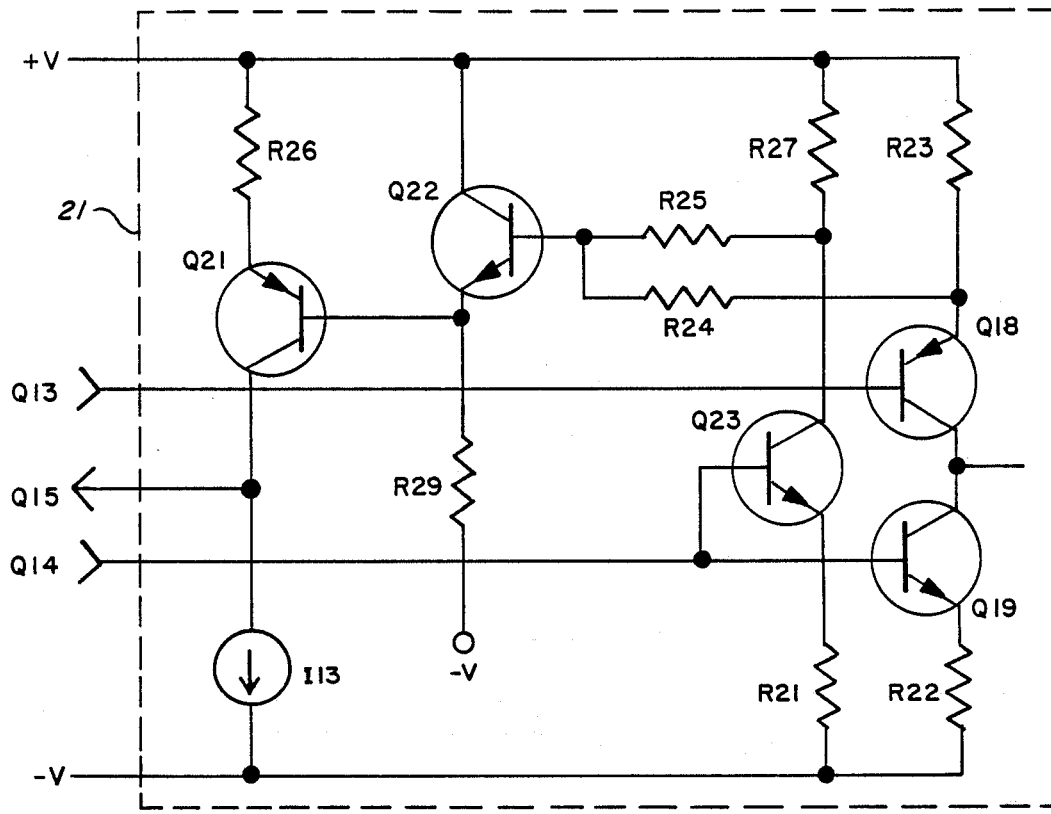
FIG. 3 is a circuit diagram of modified output and feedback stages for use with the transistor amplifier of FIG. 1.

Referring next to FIG. 3, the output and feedback stage 20 of amplifier circuit of FIG. 2 has been modified as shown in output and feedback stage 21 to provide an alternative embodiment of amplifier circuit. The gate terminal of transistor Q15 (in FIG. 2) is coupled through current source I13 to the negative voltage supply and to the collector terminal of PNP transistor Q21. The emitter terminal of transistor Q21 is coupled through the resistor R26 to the positive voltage supply. The base terminal of transistor Q21 is coupled to an emitter terminal of NPN transistor Q22 and through resistor R29 to the negative voltage, supply. The collector terminal of transistor Q22 is coupled to the positive voltage supply, while the base terminal of transistor is coupled to a first terminal of resistor R25 and to a first terminal of resistor R24. A second terminal of resistor R25 is coupled through resistor R27 to the positive voltage supply and is coupled to a collector terminal of NPN transistor Q23. The emitter terminal of transistor Q23 is coupled through resistor R21 to the negative voltage supply. A second terminal of resistor R24 is coupled through resistor R23 to the positive voltage supply and is coupled to the emitter terminal of transistor Q18. Transistors Q18 and Q19 are driven in a similar manner to FIG. 1 except that the base terminal of transistor Q19 is coupled to the base terminal of transistor Q23. In addition, the emitter terminal of transistor Q19 is coupled through resistor R22 to the negative voltage supply.

Figure 4:
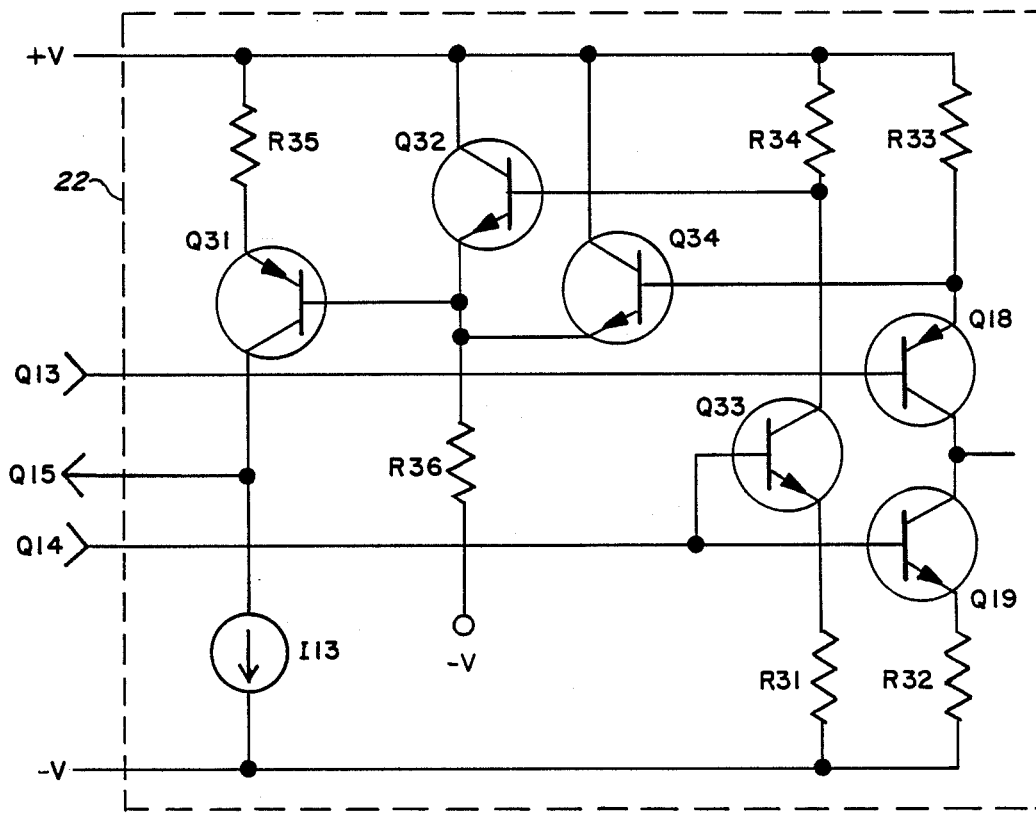
FIG. 4 is a circuit diagram of different modified output and feedback stages for use with the transistor amplifier of FIG. 1.

Referring next to FIG. 4, the output and feedback stage 20 of FIG. 2 is replaced by the output and feedback stage 22 of FIG. 4. The emitter terminal of PNP transistor Q31 is coupled through resistor R35 to the positive voltage supply while the collector terminal of transistor Q31 is coupled through the current source I13 to the negative voltage supply and is coupled to the gate terminal of transistor Q15 (FIG. 2). The base terminal of transistor Q31 is coupled to an emitter terminal of NPN transistor Q32, to an emitter terminal of NPN transistor Q34 and through resistor R36 to the negative voltage supply. The collector terminal of transistor Q32 is coupled to the positive voltage supply, while the base terminal of transistor Q32 is coupled through resistor R34 to the positive voltage supply and to a collector terminal of NPN transistor Q33. The base terminal of transistor Q34 is coupled through resistor R33 to the positive voltage supply and to the emitter terminal of PNP transistor Q18. The collector terminal of transistor Q18 is coupled to a collector terminal of NPN transistor Q19 (and to amplifier A1). The emitter terminal of transistor Q19 is coupled through resistor R32 to the negative voltage supply. The emitter terminal of transistor Q33 is coupled through resistor R32 to the negative voltage supply. The base terminal of transistor Q19 is coupled to the base terminal of transistor Q33 and to the collector terminal of transistor Q14 (of FIG. 2). The base terminal of transistor Q18 is coupled to the collector terminal of transistor Q13 (of FIG. 2).

Figure 5:
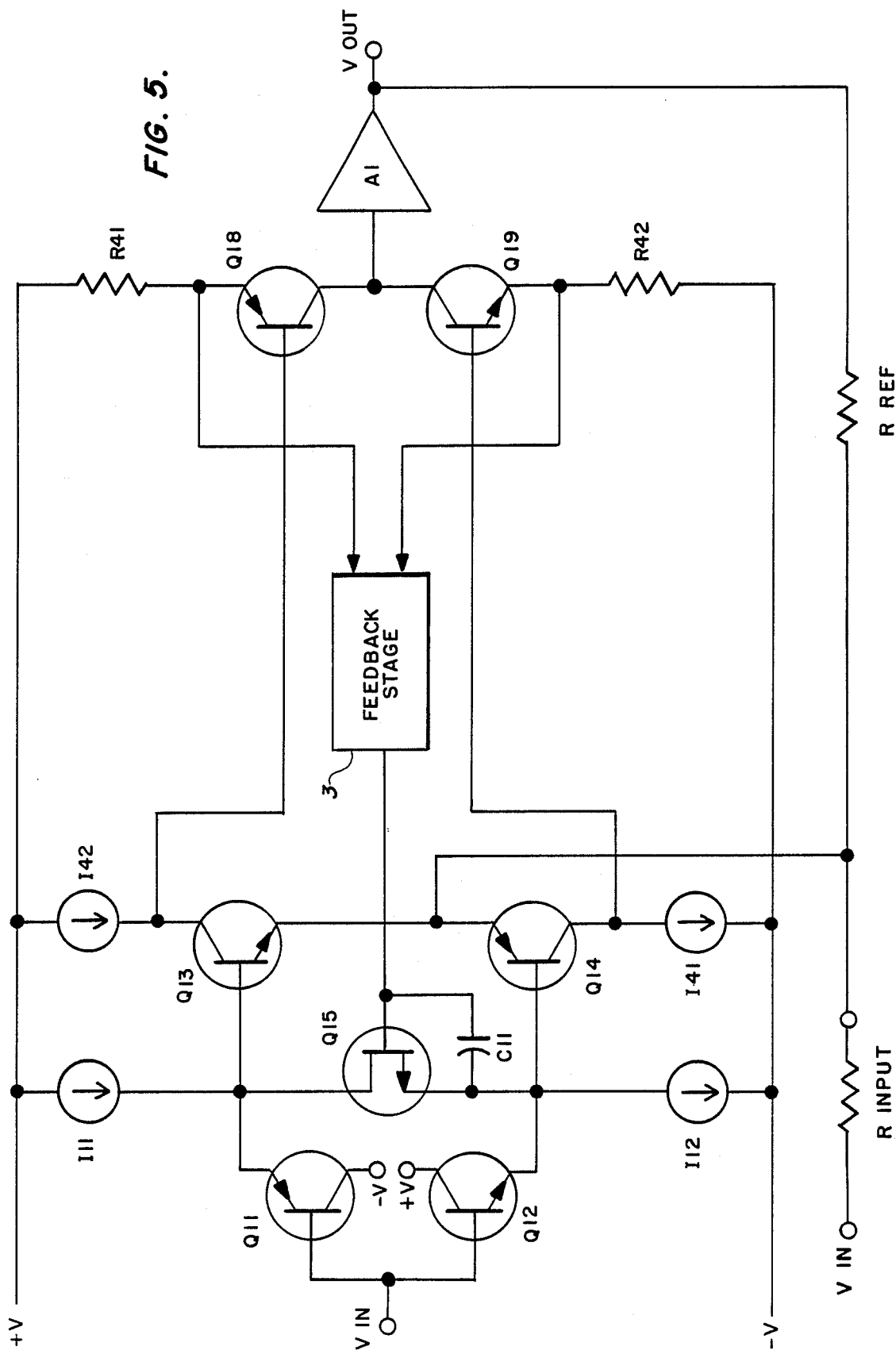
FIG. 5 is a second embodiment of a direct-coupled wide-band transistor amplifier according to the present invention.

Referring next to FIG. 5, the input voltage terminal $V_{IN}$ is coupled to a base terminal of PNP transistor Q11 and to a base terminal of NPN transistor Q12. The collector terminal of transistor Q11 is coupled to the negative supply voltage while the collector terminal of transistor Q12 is coupled to the positive voltage supply. The emitter terminal of transistor Q11 is coupled through current source I11 to the positive voltage supply and to the base terminal of NPN transistor Q13. The emitter terminal of transistor Q12 is coupled through current source I12 to the negative voltage supply and to a base terminal of PNP transistor Q14. The emitter terminal of transistor Q13 is coupled to an emitter terminal of transistor Q14, to a first terminal resistor $R_{INPUT}$ and to a first terminal of resistor $R_{REF}$. The collector of transistor Q13 is coupled through the current source I42 to the positive voltage supply and to the base terminal of PNP transistor Q18. The collector terminal of transistor Q14 is coupled through current source I41 to the negative voltage supply and to the base terminal of NPN transistor Q19. The emitter terminal of transistor Q18 is coupled through resistor R41 to negative voltage supply, while the emitter terminal of transistor Q19 is coupled through resistor R42 to the negative voltage supply. The collector terminal of transistor Q18 is coupled to the collector terminal of transistor Q19 and through amplifier A1 to an output terminal and to a second terminal of resistor $R_{REF}$. The first terminal of $R_{INPUT}$ receives the input signal $V_{IN}$. The transistor Q15 receives a signal from the feedback stage 3. The feedback stage 3 can be provided by one of the implementations shown in Fig. 2, FIG. 3 and FIG. 4.

Figure 6:
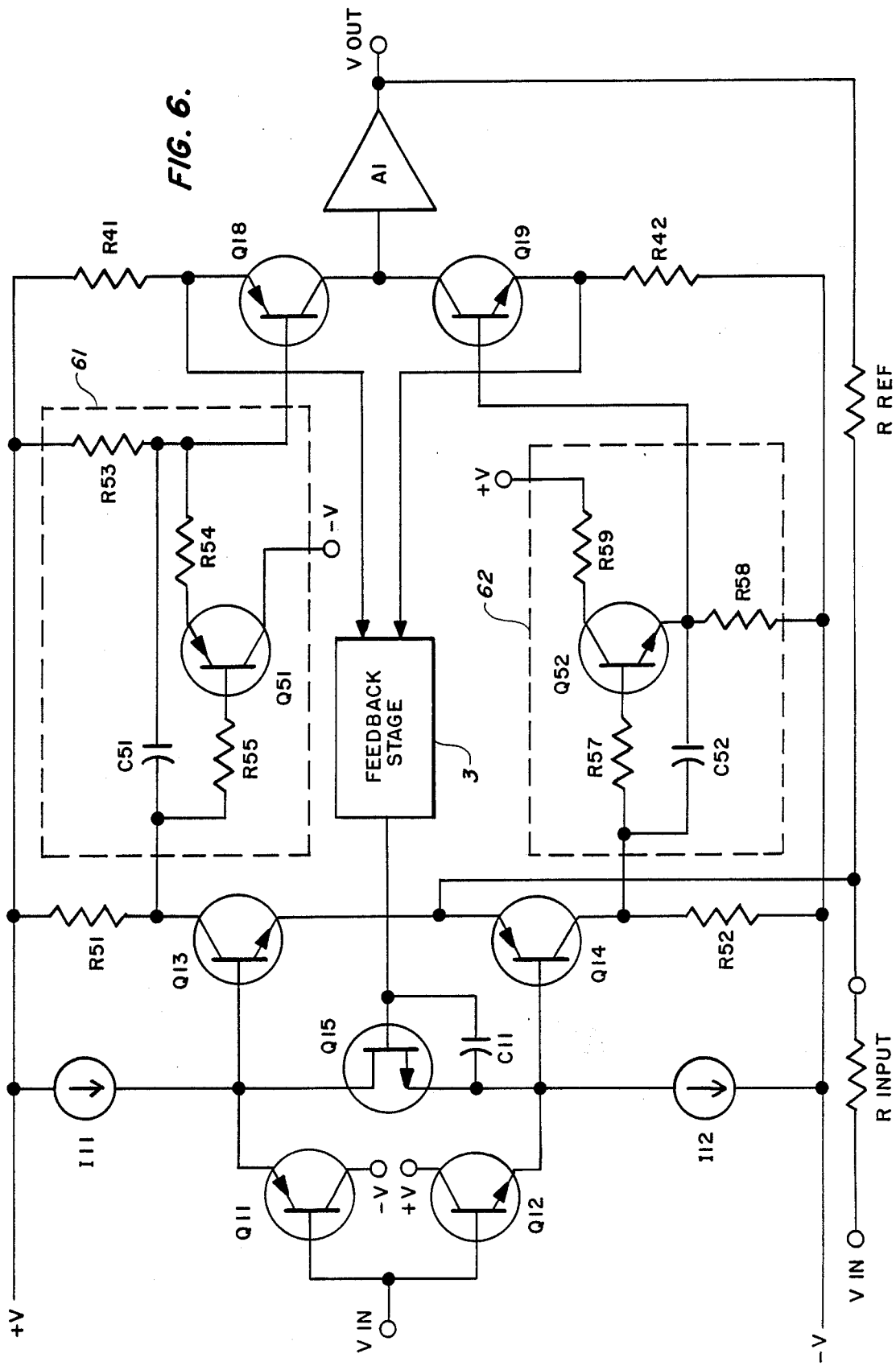
FIG. 6 is a third embodiment of a direct-coupled wide-band transistor amplifier according to the present invention.

Referring next to FIG. 6, an amplifier circuit similar to that illustrated in FIG. 5, is shown. The difference between the circuits of the two figures lies in the circuits coupled to the collector terminal of transistor Q13 and the collector terminal of transistor Q14. The collector terminal of transistor Q13 is coupled through resistor R51 to the positive voltage supply, through resistor R55 to a base terminal of PNP transistor Q51 and to a first terminal of capacitor C51. A second terminal of capacitor C51 is coupled through resistor 53 to the positive supply voltage, through resistor R54 to the emitter terminal of transistor Q51 and to the base terminal of transistor Q18. The collector terminal of transistor Q51 is coupled to the negative supply voltage. The collector of transistor Q14 is coupled through resistor R52 to the negative voltage supply, through resistor R57 to a base terminal of NPN transistor Q52 and to a first terminal of capacitor C52. A second terminal of capacitor C52 is coupled though resistor R58 to the negative voltage supply, to the emitter terminal of transistor Q52 and to the base terminal of transistor Q19. The collector terminal of transistor Q52 is coupled through resistor R59 to the positive supply terminal. The feedback apparatus is indicated by feedback stage 3 and can be implemented by the the feedback apparatus described previously. (As will be described below, circuit 61 and circuit 62 are alternative embodiments for coupling transistor Q13 with transistor Q18 and transistor Q14 with transistor Q19. Circuits 61 and 62 will both be implemented by the same circuit in the preferred embodiment.)

Figure 7:
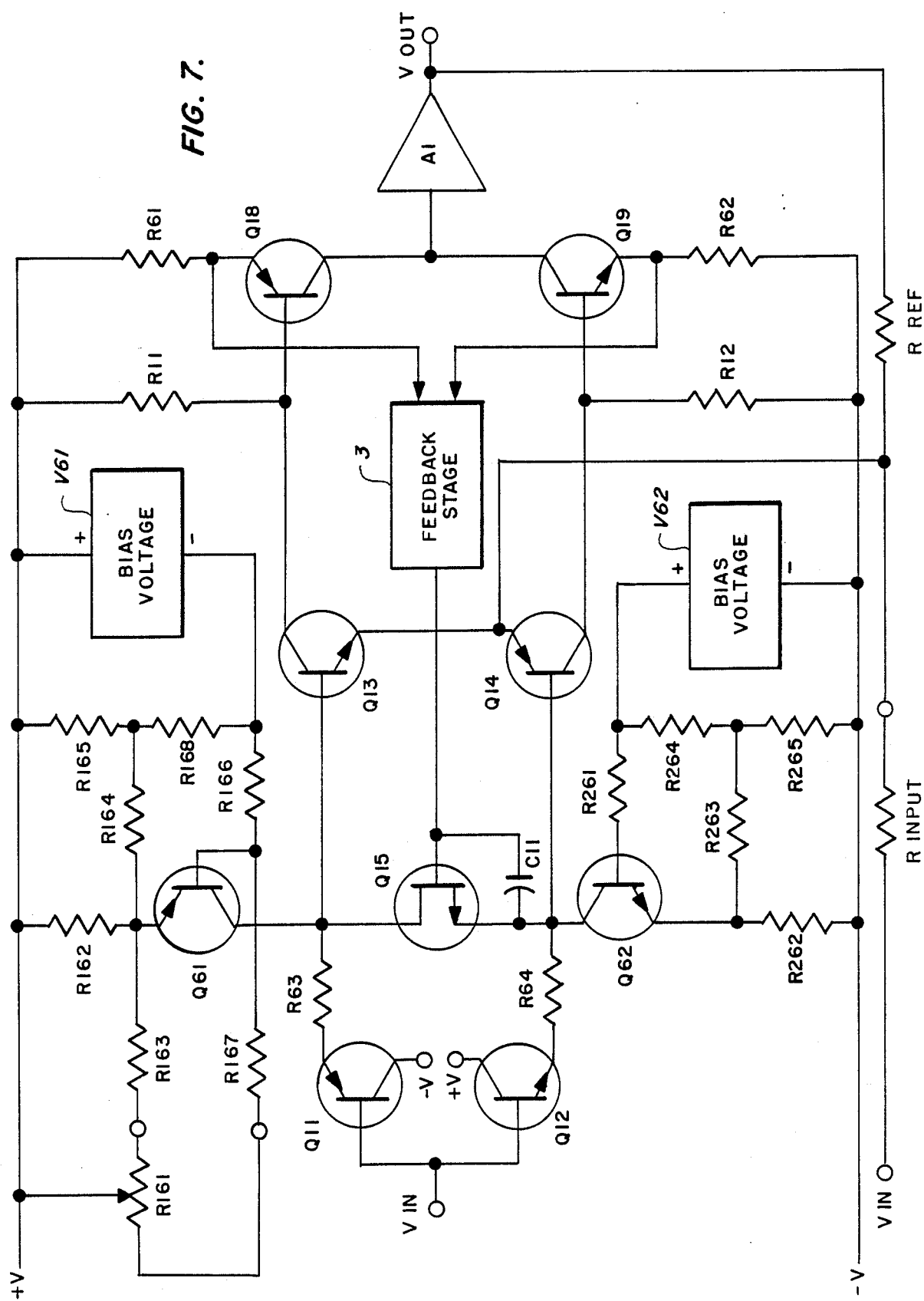
FIG. 7 is a technique for compensating for voltage offset and temperature drift according to the present invention.

Referring to FIG. 7, the circuit illustrated therein is similar to the circuit of FIG. 2. In Fig. 7, the emitter terminal of transistor Q18 is coupled through the resistor R61 to the positive voltage supply and the emitter terminal of transistor Q19 is coupled through resistor R62 to the negative voltage supply, resistors R61 and R62 replacing the active component networks of FIG. 2. The emitter terminal of transistor Q11 is coupled through resistor R63 to the base terminal of transistor Q13 and the drain terminal of transistor Q15. In addition, the drain terminal of transistor Q15 and the base terminal of transistor Q13 are coupled to a collector terminal of PNP transistor Q61. The base terminal of transistor Q61 is coupled through resistor R167 to a first terminal of rheostat R161 and through resistor R166 to a negative terminal of bias voltage unit V61 and to a first terminal of resistor R168. The positive terminal of bias voltage unit V61 is coupled to the positive voltage supply. The emitter terminal of transistor Q61 is coupled through resistor R162 to the positive voltage supply, through resistor R163 to a second terminal of rheostat R161 and through resistor R164 to a second terminal of resistor R168 and to a first terminal of resistor R165, the second terminal of resistor R165 being coupled to the positive voltage supply. The variable terminal of rheostat R161 is coupled to the positive voltage supply. The emitter terminal of transistor Q12 is coupled through resistor R64 to the source terminal of transistor Q15, to a first terminal of capacitor C11, to a base terminal of transistor Q14 and to a collector terminal of NPN transistor Q62. The base terminal of transistor Q62 is coupled through resistor R261 a first terminal of resistor R264 and to the positive terminal of bias voltage unit V62, the negative terminal of voltage unit V62 being coupled to the negative voltage supply. The emitter terminal of transistor Q62 is coupled through resistor R262 to the negative voltage supply, through resistor R263 to a second terminal of resistor R264 and to a first terminal of resistor R265, the second terminal of resistor R265 being coupled to the negative voltage supply. The feedback stage 3 coupled between transistors Q18 and Q19 and the gate terminal of transistor Q15 can be implemented by the components described previously. Resistors R162, R164, R262 and R263 are trimmable resistors in the preferred embodiment and, as described below are used to provide temperature compensation and input voltage terminal offset compensation. The bias voltage V61 and V62 are implemented with Zener diodes in the preferred embodiment.

2. Operation of the Preferred Embodiment

Referring once again to FIG. 2, the transistor pair Q1 and Q2 and transistor pair Q3 and Q4 form current mirror circuits. The circuit uses the high voltage gain provided at transistor Q1 and the constant current source I13 to maintain the sum of the emitter currents of transistor Q18 and Q19 at a fixed level. The current through the negative driver transistor Q19 is reflected through the current mirror formed by transistors Q3 and Q4 and the current mirror formed by transistors Q1 and Q2. The total output current of transistor Q1 causes a voltage to be developed across the current source I13. The voltage across current source I13 is the voltage applied to the gate terminal of transistor Q15. Transistor Q15 determines the current in the input stage of the amplifier circuit and, thereby controls the output bias current. In the preferred embodiment, the output driver unit is an emitter follower circuit.

Referring to FIG. 2, resistor R15 is shown by a dotted line coupling the emitter of transistor Q1 with the positive voltage supply. This additional resistor changes the ratio of the currents flowing through the transistors Q1 and Q2 and can reduce the power dissipation as well the common mode feedback gain.

Referring once again to FIG. 3, the current through transistor Q19 is mirrored by the current through transistor Q23, the current through transistor Q23 producing a voltage across resistor R27. The current through transistor Q18 produces a voltage across resistor R23. The voltages across resistor R27 and resistor R23 are summed by resistors R24 and R25 and drive transistor Q22 and, consequently, transistor Q21. The output current of transistor Q21 then develops a voltage to be applied to gate of transistor Q15.

Referring again to FIG. 4, a feedback configuration is shown in which either transistor Q32 or transistor Q34 will be conducting, forming a portion of the feedback stage. In the feedback stages described with reference to FIG. 2 and FIG. 3, the feedback signal is a result of combining the signals resulting from the current through each of the output transistors Q18 and Q19. Therefore, the feedback signal is relatively small as compared to feedback signal provided by the circuit of FIG. 4 in that the current through only one of the output transistors, Q18 and Q19, provides the feedback control. The feedback stage of FIG. 4 is especially important in transient situations where there is an imbalance in the current flowing through the output transistors, for example, resulting from the capacitance of the amplifier A1. Amplifier A1 is typically a unity gain amplifier, such as an emitter follower circuit, provided for impedance matching considerations, i.e., for driving relatively small load impedances. The effect of the feedback stage of FIG. 4 is to permit a larger feedback signal to be generated, resulting in a higher frequency response (i.e., slew rate) due to additional current that is available to charge the capacitance of circuit elements.

Referring to FIG. 5, placing current sources in the collector terminals of transistor Q13 and Q14 results in a greater sensitivity to current flowing through those transistors, i.e., increases the load impedances of the transistors. The result of this load impedance increase is a higher open loop gain (for DC and mid-frequency operation.).

Referring to again to FIG. 6, the circuit 61 and circuit 62 are two embodiments of circuits used to transfer activation signals from the input stage to the output stage. Typically, the transistors Q18 and Q13 are high frequency, low beta elements. As a result, the base current of transistor Q18 loads the collector terminal of transistor Q13, causing a DC offset potential between the two input terminals and lowering the gain of the signal path. Adding an emitter follower stage can result in instability resulting from phase shift considerations. However, the capacitor/transistor combination shown in circuit 61 or in circuit 62 reduces the signal phase shift as a result of the separation of the DC and AC signal components. The resistors R55 and R54 of circuit 61 and the resistors R57 and R58 of circuit 62 are chosen to provide an attenuation (of the phase shift) of a transient signal through the associated transistor while maintaining the steady state signal level at base terminals of the ouput transistors Q18 and Q19.

Referring again to FIG. 7, the current sources, including the transistors Q61 and Q62, are coupled into the input stage of the amplifier such that voltage drops are created across resistors R63 and R64 and the emitter resistances associated with transistors Q11 and Q12. In this arrangement, equal or equally changing currents do not affect the voltage offset in the input stage transistors, while providing an imbalance can compensate for the voltage offset errors. The current sources, controlled by transistor Q61 and Q62 can adjusted (by appropriate trimming of the resistors) to compensate for the voltage offset errors. Using the current source with transistor Q61 as an example, the bias voltage unit V61, the transistor Q61 and the resistor R162 form a current source with a predictable temperature coefficient provided by the temperature dependent change in the base-emitter voltage of transistor Q61. Changing the resistance of resistor R162 affects the voltage offset magnitude. However, because the temperature coefficient of the two current sources will match, the change will have minimal effect on the voltage offset temperature drift. Resistor R165 and resistor R168 form a voltage dividing network providing an zero temperature coefficient which can adjust the voltage across resistor R168 in concert with the base-emitter voltage. The arrangement provides a smaller voltage across resistor R164 as compared to resistor R162. Therefore, the adjustment of resistor R164 produces a current change that is sensitive to the temperature coefficient of the base emitter voltage of transistor Q61. The principal effect of adjusting resistor R164 is the compensation of the temperature coefficient, while the principal effect of adjusting resistor R162 is control of the magnitude of the current. (When the voltage across resistor R168 is identical to the base-emitter voltage of transistor Q61, then the changing of resistor R164 will have no effect on the amplifier output so that no criteria for successful compensation can be established.) The predictable temperature coefficient of the transistor Q61, along with the typical uncompensated performance of the input stage, permits selection of all resistor values and ranges to provide improved yield. Furthermore, the predictability of the temperature coefficient permits the automation of the resistor adjustment (i.e., via a trimming operation) which optimizes initial and drift voltage offset performance with a single adjustment operation (for two resistors) based on an equation that predicts trim based on the measured voltage offset.

In the preferred embodiment, the compensation process is performed in the following matter. The voltage offset value is measured between the two input stage terminals (i.e., the base terminals of transistors Q11 and Q12 are coupled to ground and the voltage from ground to the emitter terminals of transistors Q13 and Q14 is measured). The voltage offset is next measured for a second temperature. Depending on the polarity of the voltage offset, either resistor R262 or resistor R162 is trimmed to provide a predetermined offset voltage. (The offset voltage is not set to zero because the adjustment for the voltage offset will cause a change in the temperature compensation.) Depending on the polarity of the temperature drift, either resistor R263 or resistor R164 will be trimmed in the final step. Because the equation describing the temperature dependence of the voltage offset is available, the offset voltage, resulting from adjusting the resistor (i.e., either R162 or R262) having the principal influence on the voltage offset but prior to the adjusting the resistor (i.e., either R263 or R164) having the principal influence on the temperature drift, can be determined. Thus, the temperature drift and voltage offset can be compensated for by two trimming operations, but without requiring an iterative process. It will be clear that the order of compensation for the temperature drift voltage offset will be unimportant. Rheostat R161 is used as a final adjustment (principally for voltage offset) when the amplifier circuit is in place.

The transistor Q15, shown in FIG. 2, FIG. 5, FIG. 6 and FIG. 7, provides control of the voltage applied to transistor Q13 and transistor Q14. In the preferred embodiment, transistor Q15 is implemented by a field effect transistor to minimize the current introduced into the circuit by the control (gate) element. However, other components such as bipolar transistors can be used to couple the feedback path to the input stage. In several of the embodiments of the present invention, current source units are employed to increase the sensitivity. Typically, an attempt to increase the current through a current source results in a large increase of voltage across the current source. As implemented in the present invention, this increase in current can be used to provide improved feedback control.

The foregoing description is included to illustrate the operation of the preferred embodiment and is not meant to limit the scope of the invention. The scope of the invention is to be limited only by the following claims.

From the foregoing description, many variations will be apparent to those skilled in the art that would yet be encompassed by the spirit and scope of the invention.

What is claimed is:

1. A wide-band direct-coupled transistor amplifier circuit having a feedback network, said amplifier circuit comprising:
   an input means receiving an input signal and providing intermediate signals, said input means including;
      a first pair of complementary transistors having base terminals thereof coupled together, said coupled first transistor pair base terminals having said input signal applied thereto, and
      a second pair of complementary transistors having emitter terminals thereof coupled together, each base terminal of said second pair of transistors coupled to an emitter terminal of an associated one of said first pair of transistors;
   an output means for providing an output signal, said output means including a third pair of complementary transistors having collector terminals thereof coupled together, said coupled third transistor pair collector terminals providing said output signal, wherein a base terminal of each of said third transistor pair is coupled to a collector terminal of an associated one of said second transistor pair; and
   a feedback means including;
      transistor means coupled between said second transistor pair base terminals,
      first series transistor means coupled to an emitter terminal of a first transistor of said third transistor pair and responsive to current through said first transistor of said third transistor pair,
      second series transistor means coupled to an emitter terminal of a second transistor of said third transistor pair and responsive to current through said second transistor of said third transistor pair,
      a biasing transistor,
      constant current source coupled to a collector terminal of said biasing transistor, wherein said biasing transistor collector terminal is coupled to a control terminal of said transistor means, a base terminal of said biasing transistor being coupled to said first and said second series transistor means, wherein a change in current through said third transistor pair causes a change in voltage of said biasing transistor collector terminal.

2. The transistor amplifier circuit of claim 1 wherein said first series transistor means is coupled to said biasing transistor to provide a first current mirror circuit, wherein said second series transistor means is a second current mirror circuit, wherein a first transistor of each current mirror circuit has a collector terminal coupled to an emitter terminal of said coupled third transistor pair transistor, a collector terminal of a second transistor of said second current mirror circuit being coupled to said biasing transistor base terminal.

3. The transistor amplifier circuit of claim 1 wherein said second series transistor means includes:
   a second feedback resistor having a first terminal coupled to said third transistor pair second transistor emitter terminal; and
   a second feedback transistor having a base terminal coupled to said third transistor pair second transistor base terminal; wherein said first series transistor means includes:
      a first feedback resistor coupled to said third transistor pair first transistor emitter terminal; and
      a first feedback transistor having a base terminal coupled to said third transistor pair first transistor emitter terminal, said first feedback transistor base terminal coupled to a collector terminal of said second feedback transistor, wherein an emitter terminal of said first feedback transistor is coupled to said biasing transistor base terminal.

4. The transistor amplifier circuit of claim 1 wherein said second series transistor means includes:
   a second feedback resistor coupled to said third transistor pair second transistor emitter terminal;
   a second feedback transistor having a base terminal coupled to said base terminal of said third transistor pair second transistor; and
   a third feedback transistor having a base terminal coupled to a collector terminal of said second feedback transistor, an emitter terminal of said third feedback transistor being coupled to said biasing transistor base terminal;
   and wherein said first series transistor means includes:
      a first feedback resistor coupled to said third transistor pair first transistor emitter terminal; and
      a first feedback transistor having a base terminal coupled to said third transistor pair first transistor emitter terminal, an emitter terminal of said first feedback transistor coupled to said biasing transistor base terminal.

5. The transistor amplifier circuit of claim 1 further comprising:
   a first constant current source coupled to an emitter terminal of first transistor of said first transistor pair;
   a second constant current source coupled to an emitter terminal of a second transistor of said first transistor pair;
   a third constant current source coupled to a collector terminal of a first transistor of said second transistor pair; and
   a fourth constant current source coupled to a collector terminal of a second transistor of said second transistor pair.

6. The transistor amplifier circuit of claim 1 further comprising:
   first and second coupling means for coupling each of said second transistor pair collector terminals to said base terminals of said associated third pair of transistors, said first and said second coupling means including a coupling transistor having a base terminal coupled to said collector terminal of said associated second transistor pair transistor, said coupling transistor having an emitter terminal coupled to a base terminal of said associated third transistor pair transistor, wherein said emitter terminal of said coupling transistor is coupled to said associated second transistor pair transistor collector terminal through a capacitor.

7. The transistor amplifier circuit of claim 1 further comprising a first and a second temperature compensation means coupled to base terminals of associated first and second transistors of said second transistor pair respectively, said temperature compensation means each including:
   a first resistor coupled between said associated second transistor pair transistor base terminal and an emitter terminal of an associated first transistor pair transistor;

a compensation transistor having a collector terminal coupled to said associated second transistor pair transistor base terminal;

a first adjustable resistor, said compensation transistor having an emitter terminal coupled to said first adjustable resistor for generally providing magnitude compensation; and a second adjustable resistor, said transistor emitter terminal coupled to said second adjustable resistor for providing temperature compensation.

8. The transistor amplifier circuit of claim 1 wherein said transistor means includes an field effect transistor, said transistor means further including a capacitor coupled between a gate terminal and a source terminal of said field effect transistor.

9. The transistor amplifier circuit of claim 1 further comprising an amplifier circuit receiving an input signal from said coupled third stage transistor collector terminals, said amplifier circuit having an output signal coupled to said second transistor pair coupled emitter terminals.

10. A feedback transistor amplifier circuit comprising:

an input stage including a first and a second complementary transistor, said first and said second complementary transistors having base terminals thereof coupled together for receiving an input signal;

an intermediate stage including a third and a fourth complementary transistor, said third and said fourth complementary transistors having emitter terminals thereof coupled together, wherein an emitter terminal of said first transistor is coupled to a base terminal of said third transistor and an emitter terminal of said second transistor is coupled to a base terminal of said fourth transistor;

an output stage including a fifth and a sixth complementary transistor, said fifth and said sixth transistors having collector terminals thereof coupled together, wherein a collector terminal of said third transistor is coupled to a base terminal of said fifth transistor and wherein a collector terminal of said fourth transistor is coupled to a base terminal of said sixth transistor;

first feedback means coupled to collector terminals of said fifth and sixth transistors for applying a signal to emitter terminals of said third and fourth transistors;

first current source means coupled to said emitter terminal of said first transistor;

second current source means coupled to said emitter terminal of said second transistor;

feedback transistor means coupled between said third and said fourth transistor base terminals; and second feedback means for monitoring current through said fifth and said sixth transistors, wherein an output signal from said second feedback means is coupled to a control terminal of said feedback transistor means;

wherein said first and said second current source means each include means for compensating for at least a one of voltage offset and temperature drift parameters.

11. The feedback transistor amplifier circuit of claim 10 wherein each said means for compensating includes a first and a second adjustable resistor and is controlled by adjustment of said first resistor in a one of said first and said second current sources and, subsequently, by adjustment of said second resistor in a one of said first and said second current sources.

12. A feedback transistor amplifier circuit comprising:

an input stage including a first and a second complementary transistor, said first and said second complementary transistors having base terminals thereof coupled together for receiving an input signal;

an intermediate stage including a third and a fourth complementary transistor, said third and said fourth complementary transistors having emitter terminals thereof coupled together, wherein an emitter terminal of said first transistor is coupled to a base terminal of said third transistor and an emitter terminal of said second transistor is coupled to a base terminal of said fourth transistor;

an output stage including a fifth and a sixth complementary transistor, said fifth and said sixth transistors having collector terminals thereof coupled together, wherein a collector terminal of said third transistor is coupled to a base terminal of said fifth transistor and wherein a collector terminal of said fourth transistor is coupled to a base terminal of said sixth transistor;

first feedback means coupled to collector terminals of said fifth and sixth transistors for applying a signal to emitter terminals of said third and fourth transistors;

first current source means coupled to said emitter terminal of said first transistor;

second current source means coupled to said emitter terminal of said second transistor;

feedback transistor means coupled between said third and said fourth transistor base terminals; and second feedback means for monitoring current through said fifth and said sixth transistors, wherein an output signal from said second feedback means is coupled to a control terminal of said feedback transistor means; wherein said second feedback means includes:

a current source; and a control transistor having a collector terminal coupled to said current source, said current source providing a high impedance load for said control transistor, said control transistor collector terminal being coupled to said control terminal of said feedback transistor means.

13. The feedback transistor amplifier of claim 12 wherein said second feedback means includes;

a first mirror transistor coupled to said control transistor to form a first current mirror, wherein said first current mirror first transistor has a collector terminal coupled to a fifth transistor emitter terminal;

a second current mirror, wherein a second current mirror first transistor has a collector coupled to an emitter of said sixth transister, a collector terminal of a second current mirror second transistor being coupled to a base terminal of said control transistor.

14. The feedback transistor amplifier of claim 12 wherein said second feedback means includes:

a seventh transistor having a base terminal coupled to a base terminal of said sixth transistor; and an eighth transistor having a base terminal coupled to a collector terminal of said seventh transistor and coupled to an emitter terminal of said fifth transistor, wherein an emitter terminal of said eighth transistor is coupled to said base terminal of said control transistor.

15. The feedback transistor amplifier of claim 12 wherein said second feedback means includes:
   a seventh transistor having a base terminal coupled to said sixth transistor base terminal;
   an eighth transistor having a base terminal coupled to a collector terminal of said seventh transistor, said eighth transistor having an emitter terminal coupled to a base terminal of said control transistor;
   a ninth transistor having a base terminal coupled to an emitter terminal of said fifth transistor, an emitter terminal of said ninth transistor being coupled to said control transistor base terminal.

16. The feedback transistor amplifier circuit of claim 12 further including a third and a fourth current source, wherein said collector of said third transistor is coupled to said third current source and wherein said collector terminal of said fourth transistor is coupled to said fourth current source.

17. The feedback transistor amplifier circuit of claim 12 further comprising circuit means, said circuit means including:
   a seventh and an eighth transistor, said seventh and said eighth transistors having base terminals coupled to collector terminals of said third and fourth transistors respectively and having emitter terminals coupled to base terminals of said fifth and said sixth transistors respectively, wherein said circuit means includes a first capacitor coupled between said collector terminal of said third transistor and said base terminal of said fifth transistor and a second capacitor coupled between said collector terminal of said fourth transistor and said base terminal of said sixth transistor.

18. The feedback transistor amplifier circuit of claim 12 wherein said first, fourth and fifth transistors are PNP transistors and said second, third and sixth transistors are NPN transistors.

19. The feedback transistor amplifier circuit of claim 18 wherein said feedback transistor means includes a field effect transistor having a drain terminal coupled to said third transistor base terminal and a source terminal coupled to said fourth transistor base terminal, said control terminal of said feedback transistor means being a gate terminal of said field effect transistor.

* * * * *